(12) United States Patent
Lai et al.

(10) Patent No.: US 9,548,417 B2
(45) Date of Patent: Jan. 17, 2017

(54) EPITAXIAL STRUCTURE WITH PATTERN MASK LAYERS FOR MULTI-LAYER EPITAXIAL BUFFER LAYER GROWTH

(71) Applicant: PlayNitride Inc., Tainan (TW)

(72) Inventors: Yen-Lin Lai, Tainan (TW); Jyun-De Wu, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/809,271

(22) Filed: Jul. 26, 2015

(65) Prior Publication Data
US 2016/0099380 A1    Apr. 7, 2016

(30) Foreign Application Priority Data
Oct. 2, 2014   (TW) .............................. 103134380 A

(51) Int. Cl.
*H01L 33/12*    (2010.01)
(52) U.S. Cl.
CPC ..................................... *H01L 33/12* (2013.01)
(58) Field of Classification Search
CPC ........................... H01L 33/12; H01L 21/76248
See application file for complete search history.

(56) References Cited

U.S. PATENT DOCUMENTS

| | | | | |
|---|---|---|---|---|
| 4,522,661 | A * | 6/1985 | Morrison | H01L 21/02532 117/923 |
| 5,326,716 | A * | 7/1994 | Bauser | H01L 21/02381 117/56 |
| 6,111,277 | A * | 8/2000 | Ikeda | H01L 33/007 257/103 |
| 8,436,377 | B2 * | 5/2013 | Lin | H01L 33/12 257/200 |

OTHER PUBLICATIONS

Weeks, T. W. "GaN thin films deposited via organometallic vapor phase epitaxy on α(6H)-SiC(0001) using high-temperature monocrystalline AIN buffer layers" Appl. Phys. Lett. 67 (3), 401 Jul. 17, 1995 pp. 401-403.*
Nam, O.H. "Organometallic Vapor Phase Lateral Epitaxy of Low Defect Density GaN Layers" Mat. Res. Soc. Symp. Proc. vol. 482 Fall/1998 pp. 301-306.*

\* cited by examiner

*Primary Examiner* — Matthew Landau
*Assistant Examiner* — Grant Withers
(74) *Attorney, Agent, or Firm* — Jianq Chyun IP Office

(57) ABSTRACT

An epitaxial structure including an epitaxial substrate, a first buffer layer, a first pattern mask layer, a second buffer layer and a second pattern mask layer. The first buffer layer is disposed on the epitaxial substrate. The first pattern mask layer is disposed on the first buffer layer. The second buffer layer is disposed on the first pattern mask layer and a part of the first buffer layer. The second pattern mask layer is disposed on the second buffer layer. A projection of the first pattern mask layer projected on the first buffer layer and a projection of the second pattern mask layer projected on the first buffer layer cover at least 70% of the total area of the first buffer layer.

8 Claims, 2 Drawing Sheets

EPITAXIAL STRUCTURE WITH PATTERN MASK LAYERS FOR MULTI-LAYER EPITAXIAL BUFFER LAYER GROWTH

CROSS-REFERENCE TO RELATED APPLICATION

This application claims the priority benefit of Taiwan application serial no. 103134380, filed on Oct. 2, 2014. The entirety of the above-mentioned patent application is hereby incorporated by reference herein and made a part of this specification.

BACKGROUND OF THE INVENTION

1. Field of the Invention

The invention relates to an epitaxial structure, and particularly relates to an epitaxial structure having fewer defects.

2. Description of Related Art

Light emitting diodes (LED) are semiconductor devices manufactured by using compound (e.g., gallium nitride, gallium phosphide, and gallium arsenide) containing semiconductor materials in a Group III-V element. A lifetime of the LEDs may be as long as 100,000 hours. In addition, the LEDs have the advantages of a quick responding speed (approximately $10^{-9}$ seconds), smaller size, lower power consumption, low pollution, high reliability, as well as the capability for mass production. Thus, the LEDs are broadly used in many fields. For example, LEDs are used in luminaires, traffic signal lamps, cell phones, scanners, and fax machines.

Taking the gallium nitride semiconductor for example, in the manufacturing process of the gallium nitride semiconductor, due to the differences in lattice constant and thermal expansion coefficient (CTE) between the semiconductor layer and a hetero-substrate, misfit dislocations and the thermal stress caused by CTE mismatch of the semiconductor in the epitaxial process are commonly found. Therefore, the conventional nitride semiconductor may be severely bent due to the stress and the chance of generating cracks is thus increased.

SUMMARY OF THE INVENTION

The invention provides an epitaxial structure having fewer defects.

An epitaxial structure of the invention includes an epitaxial substrate, a first buffer layer, a first patterned mask layer, a second buffer layer, and a second pattern mask layer. The first buffer layer is disposed on the epitaxial substrate. The first pattern mask layer is disposed on the first buffer layer. The second buffer layer is disposed on the first pattern mask layer and a part of the first buffer layer. The second pattern mask layer is disposed on the second buffer layer. A projection of the first pattern mask layer and a projection of the second pattern mask layer projected on the first buffer layer at least cover 70% of a total area of the first buffer layer.

According to an embodiment of the invention, the projections of the first pattern mask layer and the second pattern mask layer projected on the first buffer layer completely cover the total area of the first buffer layer.

According to an embodiment of the invention, a pattern of the first pattern mask layer and a pattern of the second pattern mask layer are complementary to each other.

According to an embodiment of the invention, each of the projection of the first pattern mask layer projected on the first buffer layer and the projection of the second pattern mask layer projected on the first buffer layer covers approximately half of the total area of the first buffer layer.

According to an embodiment of the invention, a projection of the second pattern mask layer projected on the first pattern mask layer covers a partial area of the first pattern mask layer.

According to an embodiment of the invention, a nucleating layer disposed between the epitaxial substrate and the first buffer layer is further included.

According to an embodiment of the invention, the nucleating layer is in a monocrystalline structure.

According to an embodiment of the invention, a first type semiconductor layer, an active layer, and a second type semiconductor layer are further included. The first type semiconductor layer is disposed on the second pattern mask layer. The active layer is disposed on the first type semiconductor layer. The second type semiconductor layer is disposed on the active layer.

According to an embodiment of the invention, a third buffer layer disposed between the second pattern mask layer and the first type semiconductor layer is further included.

According to an embodiment of the invention, materials of the first pattern mask layer and the second pattern mask layer include silicon oxide or silicon nitride.

According to an embodiment of the invention, a material of the epitaxial substrate includes one of sapphire, Si, $SiO_2$, GaN, AlN, spinnel, SiC, GaAs, $LiGaO_2$, $LiAlO_2$, and $MgAl_2O_4$.

Based on the above, in the epitaxial structure of the invention, the buffer layers and the pattern mask layers are formed on the epitaxial substrate, so that the pattern mask layers are able to block misfit locations in the buffer layers, so as to reduce a chance that the misfit locations in the buffer layers extend upward. Then, if a semiconductor layer is to be stacked on the second pattern mask layer subsequently, the semiconductor layer may have a preferable epitaxial quality.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
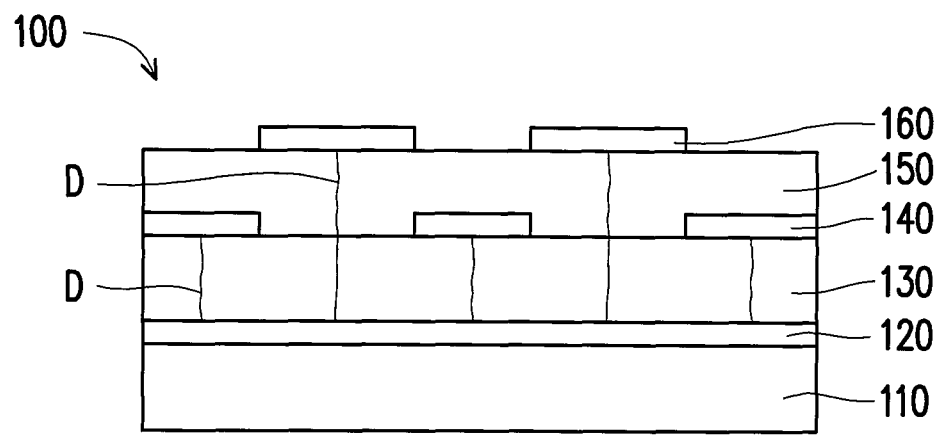
FIG. 1 is a schematic view illustrating an epitaxial structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating an epitaxial structure according to an embodiment of the invention. Referring to FIG. 1, an epitaxial structure 100 of this embodiment includes an epitaxial substrate 110, a nucleating layer 120, a first buffer layer 130, a first pattern mask layer 140, a second buffer layer 150, and a second pattern mask layer 160.

In this embodiment, the epitaxial substrate 110 is a sapphire substrate. However, in other embodiments, any substrate material capable of growing a Group III-V (e.g. a Group III nitride) semiconductor layer (e.g. a Group III nitride) may be used, such as Si, $SiO_2$, GaN, AlN, spinnel, SiC, GaAs, $LiGaO_2$, LiAlO2, or $MgAl_2O_4$.

Figure 3:
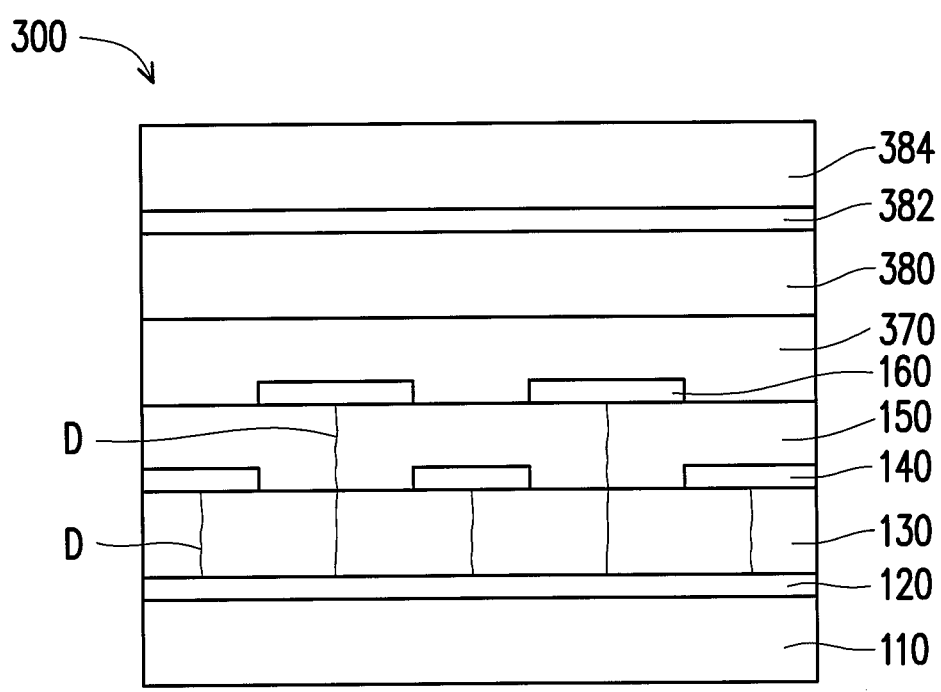
FIG. 3 is a schematic view illustrating an epitaxial structure according to another embodiment of the invention.

The nucleating layer 120 is disposed on the epitaxial substrate 110. In this embodiment, the nucleating layer 120 may form in a mono crystalline structure on the epitaxial substrate 110 through a crystal growth process. A material of the nucleating layer 120 may be AlN. However, in other embodiments, the nucleating layer 120 may be formed by a sputtering process or by a metal organic chemical vapor deposition (MOCVD) method. Of course, the method and material for forming the nucleating layer 120 are not limited thereto. The nucleating layer 120 is formed to decrease a density of defects between the epitaxial substrate 110 and semiconductor layers (e.g. the first buffer layer 130, the second buffer layer 150, a first type semiconductor layer 380, an active layer 382, and a second semiconductor layer 384, as shown in FIG. 3) and has a preferable adhesive property, so as to adhere the epitaxial substrate 110 and the semiconductor layers. Of course, in other embodiments, the nucleating layer 120 may be omitted from the epitaxial structure 100. In this way, the first buffer layer 130 is directly disposed on the epitaxial substrate 110.

As shown in FIG. 1, the first buffer layer 130 is disposed on the nucleating layer 120, the first pattern mask layer 140 is disposed on the first buffer layer 130, the second buffer layer 150 is disposed on the first pattern mask layer 140 and a part of the first buffer layer 130, and the second pattern layer 160 is disposed on the second buffer layer 150.

Since there are significant differences in lattice constant and thermal expansion coefficient between the Group III-V semiconductor layers and the epitaxial substrate 110, there may be lattice mismatch as well as mismatch in thermal expansion coefficient. In this embodiment, the first buffer layer 130 and the second buffer layer 150 are grown on the epitaxial substrate 110 first, so as to gradually improve an epitaxial quality of the semiconductor layer subsequently stacked on the epitaxial substrate 110 by using the first buffer layer 130 and the second buffer layer 150, thereby preventing a light emitting efficiency of a light emitting component formed accordingly from being influenced.

It should be noted that due to misfit dislocations, defects D may be generated in portions of the first buffer layer 130 and the second buffer layer 150. As shown by FIG. 1, the defects D in the first buffer layer 130 and the second buffer layer 150 may extend along a growing direction (i.e. an upward direction in FIG. 1). To prevent the defects D from continue to extend upward, in this embodiment, the first pattern mask layer 140 is disposed on the first buffer layer 130, and the second pattern mask layer 160 is disposed on the second buffer layer 150. The first pattern mask layer 140 covers a partial area of the first buffer layer 130 to block some of the defects D extending upward from the first buffer layer 130. Some other of the defects D in the first buffer layer 130 keep extending upward to the second buffer layer 150. The second pattern mask layer 160 covers another partial area of the second buffer layer 150, so as to block the some other of the defects D.

In other words, in the epitaxial structure 100 of this embodiment, the defects D in the buffer layers 130 and 150 are prevented from continuously extending upward by alternately stacking the pattern mask layers 140 and 160 and the buffer layers 130 and 150 and covering different positions of the buffer layers 130 and 150 with the pattern mask layers 140 and 160. In this way, the semiconductor layers subsequently stacked on the second buffer layer 150 may have a preferable epitaxial quality. It should be noted that in other embodiments, the numbers of the buffer layers and pattern mask layers that are alternately stacked may be three or more respectively, and the numbers of the buffer layers and the pattern mask layers are not limited by the above description.

Also, as shown in FIG. 1, in this embodiment, patterns of the first pattern mask layer 140 and the second pattern mask layer 160 are complementary to each other. In an actual manufacturing process, the complementary patterns may be manufactured by using a positive photoresist and a negative photoresist. Of course, in other embodiments, the patterns of the first pattern mask layer 140 and the second pattern mask layer 160 may not be complementary to each other, as long as projections of the first pattern mask layer 140 and the second pattern mask layer 160 projected on the first buffer layer 130 at least cover 70% of the total area of the first buffer layer 130. In a preferred embodiment, the projections of the first pattern mask layer 140 and the second pattern mask layer 160 projected on the first buffer layer 130 completely cover the total area of the first buffer layer 130.

In addition, each of the projection of the first pattern mask layer 140 projected on the first buffer layer 130 and the projection of the second pattern mask layer 160 projected on the first buffer layer 130 approximately covers half of the total area of the first buffer layer 130. However, in other embodiments, it is also possible that an area of the projection of the first pattern mask layer 140 projected on the first buffer layer 130 is larger or smaller than an area of the projection of the second pattern mask layer 160 projected on the first buffer layer 130. A proportion between the area of the first buffer layer 130 covered by the projection of the first pattern mask layer 140 projected on the first buffer layer 130 and the area covered by the projection of the second pattern mask layer 160 projected on the first buffer layer 130 is not limited to the above description.

It should be noted that while in FIG. 1, an area shielded by the first pattern mask layer 140 and an area shielded by the second pattern mask layer 160 are alternately distributed, in other embodiments, the first pattern mask layer 140 may only shield a left portion of the first buffer layer 130, while the second pattern mask layer 160 only shields a right portion of the second buffer layer 150. Shapes of patterns and shielding portions of the first pattern mask layer 140 and the second pattern mask layer 160 are not limited to the above description.

In this embodiment, the first buffer layer 130 and the second buffer layer 150 include a III-V Group semiconductor such as gallium nitride. Materials of the first pattern mask layer 140 and the second pattern mask layer 160 are, for example, silicon oxide. However, in other embodiments, the materials of the first pattern mask layer 140 and the second pattern mask layer 160 may also be silicon nitride. The types of the first buffer layer 130, the second buffer layer 150, the first pattern mask layer 140, and the second pattern mask layer 160 are not limited to the above description. In addition, in this embodiment, the first buffer layer 130 and the second buffer layer 150 may be formed on the epitaxial substrate 110 by using the metal organic chemical vapor deposition (MOCVD) method, and the first pattern mask layer 140 and the second pattern mask layer 160 may be respectively formed on the first pattern mask layer 140 and the second pattern mask layer 160 by using a plasma enhanced chemical vapor deposition (PECVD) method accompanied with a photolithography etching process. However, the methods of forming the respective layers are not limited to the above description.

Figure 2:
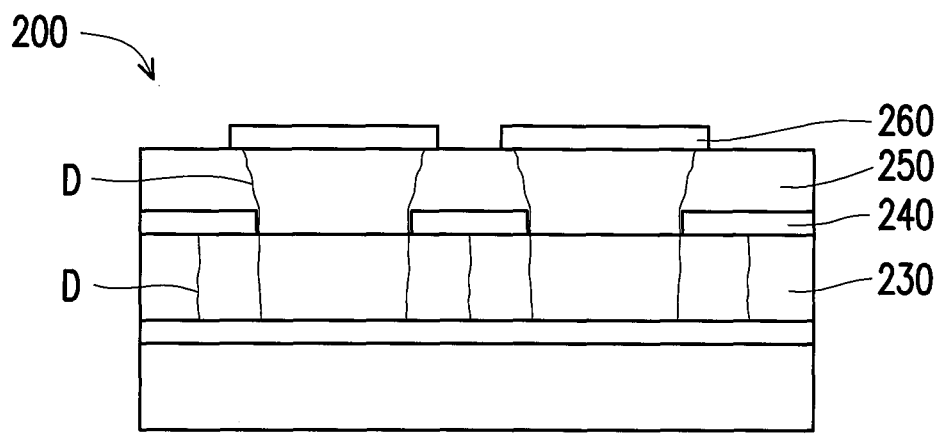
FIG. 2 is a schematic view illustrating an epitaxial structure according to another embodiment of the invention.

FIG. 2 is a schematic view illustrating an epitaxial structure according to another embodiment of the invention. Referring to FIG. 2, an epitaxial structure 200 of FIG. 2 differs from the epitaxial structure 100 of FIG. 1 in that a projection of a second pattern mask layer 260 of the epitaxial structure 200 shown in FIG. 2 projected on a first pattern mask layer 240 covers a partial area of the first mask layer 240. Namely, in this embodiment, patterns of the first pattern mask layer 240 and the second pattern mask layer 260 are not complementary to each other. A projection of the second pattern mask layer 260 projected on a first buffer layer 230 is partially overlapped with a projection of the first pattern mask layer 240 projected on the first buffer layer 230 in addition to covering an area that is not covered by a projection of the first pattern mask layer 240 projected on the first buffer layer 230.

Some of the defects D originally close to the first pattern mask layer 240 on the first buffer layer 230 but not blocked by the first pattern mask layer 240 may already be deviated from the area that is not covered by the first pattern mask layer 240 when extending upwardly to the second buffer layer 250. Thus, in this embodiment, an area covered by the second pattern mask layer 260 is enlarged, so that the second pattern mask layer 260 is partially overlapped with the first pattern mask layer 240, making these defects D still blocked by the second pattern mask layer 260.

Similarly, by alternately stacking the pattern mask layers 240 and 260 and the buffer layers 230 and 250 in the epitaxial structure 200 and making the pattern mask layers 240 and 260 respectively cover at least different positions of the buffer layers 230 and 250, the defects D in the buffer layers 230 and 250 are prevented from continuously extending upward, making the semiconductor layers subsequently stacked on the second buffer layer 250 have a preferable epitaxial quality.

FIG. 3 is a schematic view illustrating an epitaxial structure according to another embodiment of the invention. Referring to FIG. 3, in this embodiment, elements the same as or similar to the elements in the epitaxial structure 100 are referred to with the reference numerals of the similar or same elements in FIG. 1, and no further details in this respect will be further described below. An epitaxial structure 300 of FIG. 3 mainly differs from the epitaxial structure 100 of FIG. 1 in that the epitaxial structure 300 of FIG. 3 further includes a third buffer layer 370, a first type semiconductor layer 380, an active layer 382, and a second type semiconductor layer 384. The third buffer layer 370 is disposed on the second pattern mask layer 160 and a part of the second buffer layer 150, the first type semiconductor layer 380 is disposed on the third buffer layer 370, the active layer 382 is disposed on the first type semiconductor layer 380, and the second type semiconductor layer 384 is disposed on the active layer 382.

In this example, the third buffer layer 370 includes a Group III-V compound semiconductor such as gallium nitride. The first type semiconductor layer 380 is, for example, an n-type nitride semiconductor stack layer, and the second type semiconductor layer 384 is, for example, a p-type nitride semiconductor layer, and the active layer is, for example, multiple quantum wells. The first type semiconductor layer 380 and the second type semiconductor layer 384 are, for example, GaN, AlGaN, AlInGaN, or InGaN. An n-type dopant doped in the first type semiconductor layer 380 may include at least one Group IV A element, and a p-type dopant doped in the second type semiconductor layer 384 may include at least one Group II A element. In this embodiment, the n-type dopant may be silicon, and the p-type dopant may be magnesium. However, the types of the n-type and p-type dopants are not limited thereto.

The third buffer layer 370, the first type semiconductor layer 380, the active layer 382, and the second type semiconductor layer 384 may be sequentially formed on the second buffer layer 150 and the second pattern mask layer 160 by using the metal organic chemical vapor deposition (MOCVD) method. However, manufacture of the third buffer layer 370, the first type semiconductor layer 380, the active layer 382, and the second type semiconductor layer 384 are not limited thereto. In other embodiments, the epitaxial structure 300 may also omit the third buffer layer 370. In this way, the first type semiconductor layer 380 is directly disposed on the second pattern mask layer 160 and a part of the second buffer layer 150. Moreover, in other embodiments, the third buffer layer 370, the first type semiconductor layer 380, the active layer 382, and the second type semiconductor layer 384 also be formed on the epitaxial structure 100 of FIG. 2, for example, and are not limited to the above description.

As shown in FIG. 3, in the epitaxial structure 300 of this embodiment, by using the configuration that the buffer layers 130 and 150 and the pattern mask layers 140 and 160 are alternately stacked on the epitaxial substrate 110 and projections of the pattern mask layer 140 and 160 projected on any of the buffer layers 130 and 150 completely cover the buffer layers 130 and 150, the pattern mask layers 140 and 160 are able to block the defects D in the buffer layers 130 and 150, so as to reduce the chance that the defects D in the buffer layers 130 and 150 extend upward. Thus, the first type semiconductor layer 380, the active layer 382, and the second type semiconductor layer 384 formed on the third buffer layer 370 may have a preferable epitaxial quality.

Accordingly to the above, in the epitaxial structure of the invention, the plurality of buffer layers and the plurality of pattern mask layers alternately stacked are formed on the epitaxial substrate, and a combined projection area of the pattern mask layers is capable of at least covering 70% of the total area of the buffer layers, so as to increase the chance that misfit dislocations extending upward in the buffer layers are blocked by the pattern mask layers and thus decrease a density of misfit dislocations of the whole epitaxial structure. Thus, if a semiconductor layer is to be stacked on the epitaxial structure subsequently, the semiconductor layer may have a preferable epitaxial quality as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An epitaxial structure, comprising:
    an epitaxial substrate;
    a first buffer layer, disposed on the epitaxial substrate;
    a first pattern mask layer, disposed on the first buffer layer;
    a second buffer layer, disposed on the first pattern mask layer and on a part of the first buffer layer; and a second pattern mask layer, disposed on the second buffer layer, wherein in a cross section a pattern of the first pattern mask layer with a view from above the epitaxial substrate and a pattern of the second pattern mask layer with a view from above the epitaxial substrate are complementary to each other and are not overlapped with each other.

2. The epitaxial structure as claimed in claim 1, wherein each of the projection of the first pattern mask layer projected on the first buffer layer and the projection of the second pattern mask layer projected on the first buffer layer covers approximately half of the total area of the first buffer layer.

3. The epitaxial structure as claimed in claim 1, further comprising:
 a nucleating layer, disposed between the epitaxial substrate and the first buffer layer.

4. The epitaxial structure as claimed in claim 3, wherein the nucleating layer is in a monocrystalline structure.

5. The epitaxial structure as claimed in claim 1, further comprising:
 a first type semiconductor layer, disposed on the second pattern mask layer;
 an active layer, disposed on the first type semiconductor layer; and
 a second type semiconductor layer, disposed on the active layer.

6. The epitaxial structure as claimed in claim 5, further comprising: a third buffer layer, disposed between the second pattern mask layer and the first type semiconductor layer.

7. The epitaxial structure as claimed in claim 1, wherein materials of the first pattern mask layer and the second pattern mask layer comprise silicon oxide or silicon nitride.

8. The epitaxial structure as claimed in claim 1, wherein a material of the epitaxial substrate comprises one of sapphire, Si, $SiO_2$, GaN, AlN, spinnel, SiC, GaAs, $LiGaO_2$, $LiAlO_2$, and $MgAl_2O_4$.

* * * * *